(12) United States Patent
Wang et al.

(10) Patent No.: US 6,911,860 B1
(45) Date of Patent: Jun. 28, 2005

(54) ON/OFF REFERENCE VOLTAGE SWITCH FOR MULTIPLE I/O STANDARDS

(75) Inventors: Xiaobao Wang, Santa Clara, CA (US); Chiakang Sung, Milpitas, CA (US); Khai Nguyen, San Jose, CA (US); Joseph Huang, San Jose, CA (US); Bonnie Wang, Cupertino, CA (US); Philip Pan, Freemont, CA (US); Yan Chong, Stanford, CA (US); In Whan Kim, San Jose, CA (US); Gopinath Rangan, Santa Clara, CA (US); Tzung-Chin Chang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/037,716

(22) Filed: Nov. 9, 2001

(51) Int. Cl.⁷ .............................................. H03K 17/35
(52) U.S. Cl. ........................ 327/404; 327/387; 327/388; 327/333
(58) Field of Search ................................ 327/403, 404, 327/387–8, 199–201, 208, 210, 388, 333; 326/63, 68, 80, 81, 82, 83, 85

(56) References Cited

U.S. PATENT DOCUMENTS

| | | | |
|---|---|---|---|
| 4,783,607 A | 11/1988 | Hsieh | 307/475 |
| 4,820,937 A | 4/1989 | Hsieh | 307/475 |
| RE34,808 E | 12/1994 | Hsieh | 326/71 |
| 5,432,467 A | 7/1995 | Reddy | 326/81 |
| 5,465,054 A * | 11/1995 | Erhart | 326/34 |
| 5,506,528 A * | 4/1996 | Cao et al. | 327/108 |
| 5,506,535 A * | 4/1996 | Ratner | 327/333 |
| 5,550,503 A * | 8/1996 | Garrity | 327/437 |
| 5,639,680 A * | 6/1997 | Hoeld | 437/51 |
| 5,789,781 A * | 8/1998 | McKitterick | 257/347 |
| 5,828,231 A | 10/1998 | Bazargan | 326/81 |
| 5,877,632 A | 3/1999 | Goetting et al. | 326/50 |
| 5,933,025 A | 8/1999 | Nance et al. | 326/81 |
| 5,958,026 A | 9/1999 | Goetting et al. | 710/1 |
| 5,970,255 A | 10/1999 | Tran et al. | 395/893 |
| 6,025,737 A | 2/2000 | Patel et al. | 326/80 |
| 6,043,692 A | 3/2000 | Linoff | 327/117 |
| 6,118,302 A | 9/2000 | Turner et al. | 326/68 |
| 6,163,199 A * | 12/2000 | Miske et al. | 327/434 |
| 6,204,691 B1 | 3/2001 | Goetting et al. | 326/44 |
| 6,218,858 B1 | 4/2001 | Menon et al. | 326/39 |
| 6,400,189 B2 * | 6/2002 | McDaniel | 327/108 |

* cited by examiner

*Primary Examiner*—Timothy P. Callahan
*Assistant Examiner*—An T. Luu
(74) *Attorney, Agent, or Firm*—Morgan, Lewis & Bockius LLP

(57) ABSTRACT

A switch circuit selectively provides a reference voltage, needed in some I/O standards, to a logic device. The circuit receives a dedicated power supply that is different from the device's I/O supply. It may also include a level shifting circuit for converting a master control signal having a logic level determined by a first supply to a first control signal having a logic level determined by the dedicated supply. The switch circuit also includes a transmission switch that passes the reference voltage to an output in response to at least the first control signal. The transmission switch may be a CMOS transmission gate with at least one NMOS transistor controlled by the first control signal in parallel with at least one PMOS transistor controlled by a second control signal, complementary to the first. The second control signal may be generated by another level shifting circuit and have a logic level determined by the I/O supply.

26 Claims, 2 Drawing Sheets

US 6,911,860 B1

ON/OFF REFERENCE VOLTAGE SWITCH FOR MULTIPLE I/O STANDARDS

FIELD OF INVENTION

The present invention relates to the field of digital circuitry and programmable logic devices. More particularly, it relates to an on/off switch circuit for selectively passing an input reference voltage, needed in some I/O standards but not others, to input buffer circuits in a logic device.

BACKGROUND OF THE INVENTION

Digital electronic systems are commonly implemented by combining and interconnecting several different integrated circuit (IC) devices such as processors, memory devices and programmable logic devices. Programmable logic devices (PLDs) are standardized ICs that are readily customizable to perform desired functions. The various IC devices have input/output (I/O) terminals, typically pins or pads on the device, that communicate with one another by way of input and output signals transmitted over a system bus. An I/O power supply VCC_IO provides the necessary power for each device to drive I/O signals over the system bus. Many IC devices, including several types of PLDs, also have a separate internal core power supply VCC_INT that is used for processing signals within the device. The core power supply signal VCC_INT and the I/O power supply signal VCC_IO are often at different voltage levels, and the VCC_IO supply may also be more noisy than the internal core supply VCC_INT. With newer IC devices and I/O standards, the VCC_INT and VCC_IO power supply voltage levels are steadily being lowered.

Advances in process technology have also resulted in a proliferation of different standards, and IC devices may therefore communicate with one another using a variety of I/O standards. In addition to having different VCC_IO requirements, I/O standards may also differ in that they operate using either single-ended, differential, or voltage-referenced input signals. For example, basic TTL (Transistor-Transistor Logic) and LVTTL (low voltage TTL) are single-ended I/O standards in which all input signal levels are taken with respect to circuit ground, e.g., VSS. In differential type standards, such as LVDS (Low Voltage Differential Signaling), differential inputs are required so that there are two I/O terminals (or rails) for each input signal.

In voltage-referenced I/O standards, the I/O structures also use differential amplifier inputs, however one input of each differential amplifier is tied to a common input reference voltage. In many standards, the reference voltage is in the range of 0.7–1.5 V. Thus, unlike single-ended and differential type I/O standards, voltage-referenced I/O standards require that a separate input reference voltage be provided to an IC device. Existing voltage referenced I/O standards include the HSTL (High Speed Transceiver Logic) and SSTL (Stub Series Terminated Logic) standards commonly used for high-speed memory, as well as the GTL (Gunning Transceiver Logic) standard used for high speed, low power backplane communications.

In some logic devices, particularly PLDs, the I/O terminals are programmable and the device supports operation according to several different I/O standards. In these devices, the same I/O terminals receive input signals regardless of the I/O standard being used. A dedicated I/O terminal may be used to receive the input reference voltage necessary for operation in a voltage-referenced I/O standard. However, since some I/O standards do not use an externally supplied input reference, a switch circuit is needed to pass the reference voltage to I/O buffer circuits for standards that require it and block that transmission for standards that do not. Unfortunately, existing switch circuits are often not capable of adequately passing the reference voltage to the input buffers since the VCC_IO supply powering the switch circuit for a given voltage-referenced standard is relatively low (e.g., 1.5 V or less). As a result, one or more transistors in the switch circuit may not turn on sufficiently due to the low voltage supply levels. When such inadequate powering of the transistors occurs, the level of the reference voltage output by the switch circuit is too low. This is a significant concern in many PLDs, since low VCC_IO levels are becoming more common in advanced process technologies. Consequently, there is a need for a more effective on/off input reference voltage switch circuit suitable for use in devices using standards having a low VCC_IO power supply.

SUMMARY OF THE INVENTION

The present invention relates to a switch circuit that selectively provides a reference voltage, needed for operation in some I/O standards but not others, to a logic device. The switch circuit is thus suitable for use in logic devices capable of operating in multiple I/O standards where at least one the standards is voltage-referenced and at least one other is not. The switch circuit receives a dedicated power supply signal that is different and separate from an I/O supply for the device—at least when the switch is in an on state. (Optionally, a node for providing the dedicated supply signal may be shorted to the I/O supply when the switch is in a high impedance OFF state). The switch circuit includes a transmission switch circuit that passes the reference voltage from a transmission switch input to a transmission switch output in response to, at least, a first control signal. The first control signal has a logic level determined by the dedicated supply signal. The dedicated supply signal may have a voltage level greater than the lowest specified I/O supply signal level for any voltage-referenced standard. In one embodiment, the dedicated supply signal has a voltage level of about 2.5 V or greater.

In one embodiment, the switch circuit includes a logic level shifting circuit for receiving, typically from a logic core of the device, a master control signal having a logic level determined by a first supply signal, typically the core power supply. The logic level shifting circuit provides a first control signal having a logic level determined by the dedicated supply. For example, when the master control signal is at a logic high level determined by a first supply signal, the first control signal is at a logic high level determined by the dedicated supply signal.

The transmission switch circuit may include a transistor having a control terminal for receiving the first control signal. In one embodiment, that transistor is an NMOS transistor having a gate terminal for receiving the first control signal, a source terminal that provides the transmission switch circuit input, and a drain terminal that provides the transmission switch circuit output. In another embodiment, the transmission switch circuit includes first and second NMOS transistors connected in series and each having a gate terminal for receiving the first control signal.

In a further embodiment, the transmission switch is a CMOS transmission gate with one or more NMOS transistors, each having a gate terminal for receiving the first control signal, in parallel and one or more PMOS transistors, each having a gate terminal for receiving a second control signal. The PMOS transistor(s) are in parallel with the NMOS transistor(s), and the transmission switch circuit passes the reference voltage signal in response to both the first and second control signals. The second control signal is complementary to the first control signal, and may be generated by another level shifting circuit so that it has a logic level determined by the I/O supply. In this embodiment, a source terminal of the first NMOS transistor and a source terminal of the first PMOS transistor provide the transmission switch circuit input, and a drain terminal of the second NMOS transistor and a drain terminal of the second PMOS transistor provide the transmission switch circuit output. In addition, the drain terminal of the first NMOS transistor is coupled to the source terminal of the second NMOS transistor, and the drain terminal of the first PMOS transistor is coupled to the source terminal of the second PMOS transistor.

The switch circuit may further include a third PMOS transistor having a gate terminal for receiving the first control signal, a drain terminal coupled to the source terminal of the second NMOS transistor in the transmission switch, and a source terminal coupled to the dedicated supply signal. This transistor protects the switch circuit from a voltage overshoot at the transmission switch input. Similarly, to protect against a voltage undershoot, a third NMOS transistor may be employed. In this case, the third NMOS transistor has a gate terminal for receiving the second control signal, a drain terminal coupled to the source terminal of the second PMOS transistor in the transmission switch, and a source terminal coupled to a common supply reference.

The output of the transmission switch circuit is typically coupled to one or more input buffers for one or more I/O terminals of the logic device.

BRIEF DESCRIPTION OF THE DRAWINGS

The objects and advantages of the present invention will be better understood and more readily apparent when considered in conjunction with the following detailed description and accompanying drawings which illustrate, by way of example, preferred embodiments of the invention and in which.

DETAILED DESCRIPTION OF PREFERRED EMBODIMENTS

Figure 1:
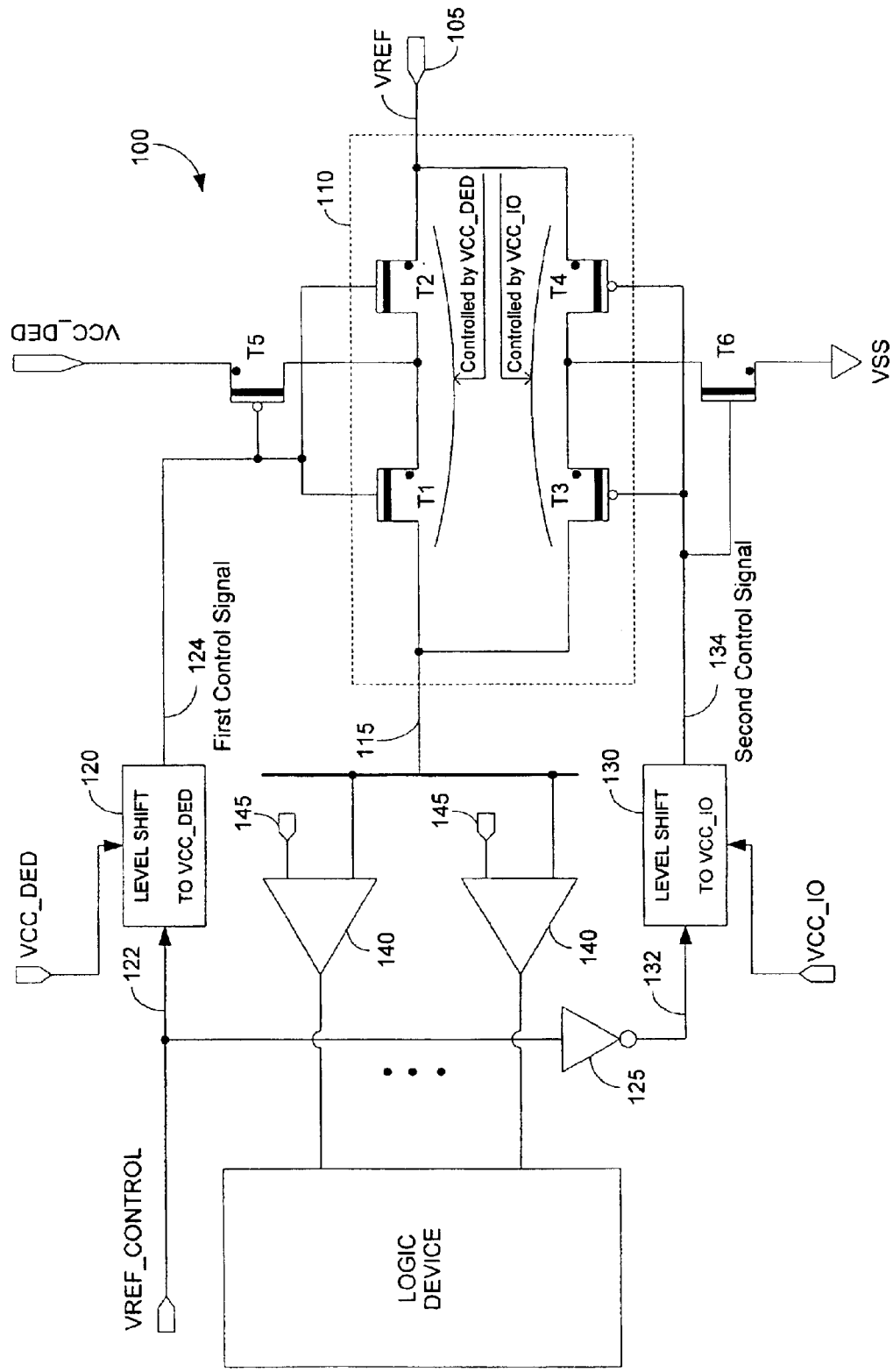
FIG. 1 is a circuit diagram of a input reference voltage switch circuit for a logic device in accordance with one embodiment of the present invention.

FIG. 1 is a circuit diagram of an input reference voltage switch circuit 100 in accordance with an embodiment of the present invention. Switch circuit 100 includes a transmission switch circuit 110 and two logic level shift circuits 120 and 130. Transmission switch 110 receives a reference voltage signal VREF at an I/O terminal 105 and is operable to selectively pass that signal to a transmission switch output 115. In one embodiment, transmission switch 110 is implemented as a CMOS (complementary metal-oxide semiconductor) transmission gate having at least one NMOS (n-channel) transistor and one PMOS (p-channel) transistor in parallel. Transmission switch 110 may include two series-connected NMOS transistors T1 and T2 in parallel with two series-connected PMOS transistors T3 and T4 as illustrated in FIG. 1. In this embodiment, the source of transistor T2 is connected to the reference voltage VREF at I/O terminal 105, the drain of transistor T2 is connected to the source of transistor T1, and the drain of transistor T1 is connected to the transmission switch output 115. Similarly, the source of transistor T4 is connected to I/O terminal 105, the drain of transistor T4 is connected to the source of transistor T3, and the drain of transistor T3 is connected to output 115. As will be appreciated by those skilled in the art, because of the symmetry of standard MOS transistors, the designation of source and drain in transistors T1, T2, T3, and T4 is not critical, but rather is used above for ease of description.

As also shown in FIG. 1, a pull-up PMOS transistor T5 has its drain connected to the drain of transistor T2 and the source of transistor T1, while the source of transistor T5 is connected to a voltage supply VCC_DED that is specifically dedicated to switch circuit 100. A pull-down NMOS transistor T6 has its drain connected to the drain of transistor T4 and the source of transistor T3, with the source of transistor T6 being connected to the most negative supply reference VSS. As described below, when transmission switch 110 is off, transistors T5 and T6 may be used to help isolate any overshoot or undershoot at I/O terminal 105 that may result from signal reflections or other causes.

Referring still to FIG. 1, logic level shift circuit 120 receives a master VREF_CONTROL signal at its input 122 from a logic device core and the dedicated supply signal VCC_DED. logic level shift circuit 130 receives an inverted or complementary version of the VREF_CONTROL signal at its input 132 and the I/O supply signal VCC_IO. In the illustrated embodiment, VREF_CONTROL is provided to input 132 via an inverter 125, but, alternatively, a complementary control signal may be generated in the logic core and then provided directly to circuit 130. As shown, the level-shifted control signal at the output 124 of logic level shift circuit 120 is provided to the gates of NMOS transistors T1 and T2 and PMOS transistor T5. The level-shifted control signal at the output 134 of circuit 130 is provided to the gates of PMOS transistors T3 and T4 and the gate of NMOS transistor T6.

Since the logic device in which switch circuit 100 is provided may operate according to different I/O standards, the level of VCC_IO may vary depending on the standard, for example from 1.5 V to 3.3 V. The level of the VCC_DED supply signal may be greater than the lowest VCC_IO level for any voltage-referenced standard and, in one particular embodiment, VCC_DED is at least about 2.5 V. As described further below, having the dedicated VCC_DED supply higher than low power VCC_IO levels allows transmission switch 110 to more effectively pass the VREF signal when gate 110 is in a low impedance (on) state.

Figure 2:
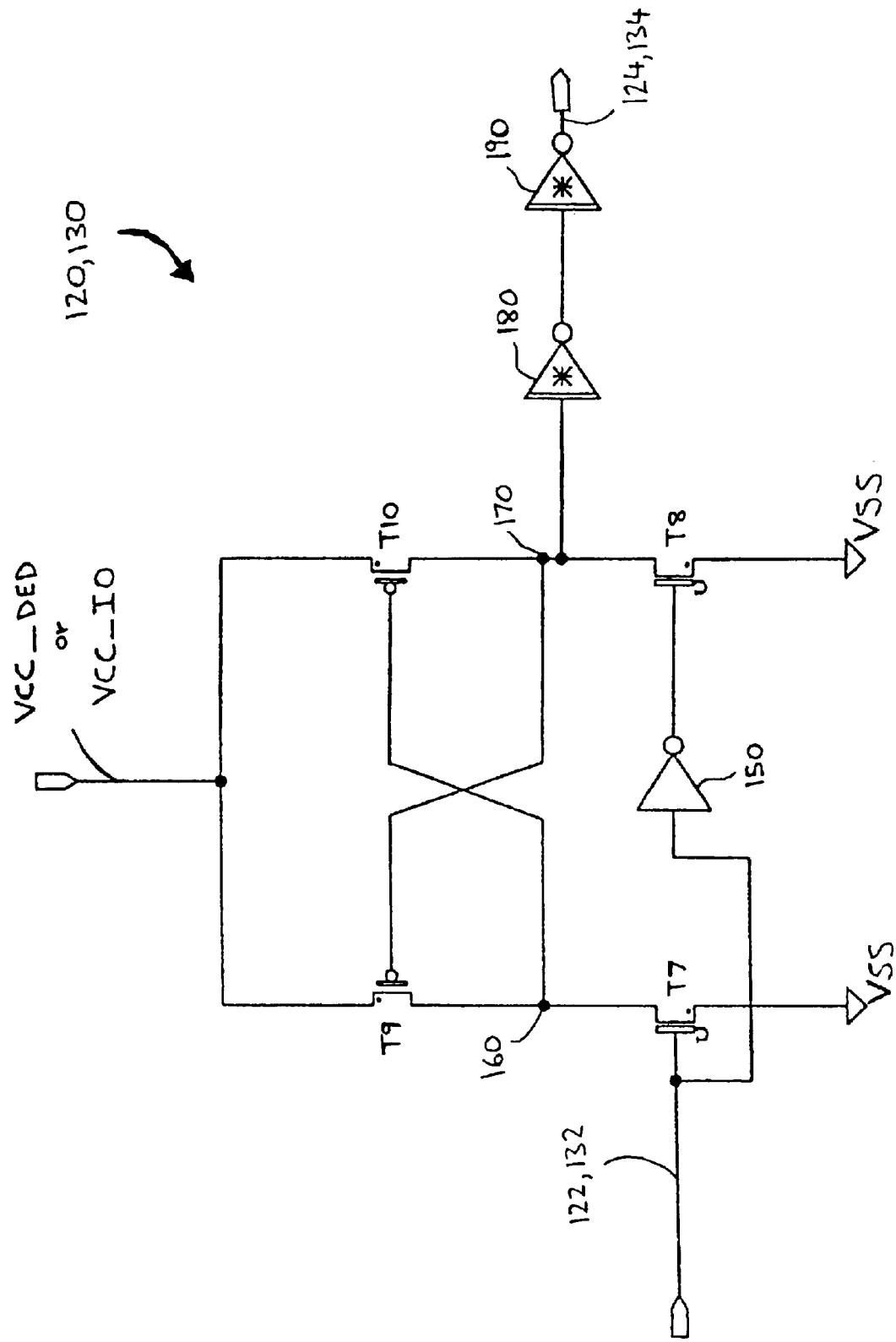
FIG. 2 is a circuit diagram of an implementation of the logic level shift circuits in FIG. 1.

One possible implementation for each of logic level shift circuit 120 and logic level shift circuit 130 is shown in FIG. 2. Each circuit 120 and 130 includes two NMOS transistors T7 and T8, two PMOS transistors T9 and T10, and an inverter 150. The source of transistor T7 is connected to the negative supply reference VSS, the drain of transistor T7 is connected to the drain of transistor T9 at a node 160, and the source of transistor T9 is connected to the supplied power signal, i.e., VCC_DED in circuit 120 and VCC_IO in circuit 130. Similarly, the source of transistor T8 is connected to VSS, the drain of transistor T8 is connected to the drain of transistor T10 at a node 170, and the source of transistor T10 is connected to the supplied power signal VCC_DED or VCC_IO. The input 122 or 132 to logic level shift circuit 120 or 130, respectively, is connected to the gate of transistor T7 and, through inverter 150, to the gate of transistor T8. The gate of transistor T9 is connected to node 170, while the gate of transistor T10 is connected to node 160. The output 124 or 134 of logic level shift circuit 120 or 130, respectively, is the signal at node 170. In the illustrated embodiment, the output 124, 134 is taken after first passing the node 170 signal through a pair of inverting buffers 180 and 190. Buffers 180 and 190 are powered by VCC_DED in circuit 120 and by VCC_IO in circuit 130.

Referring again to FIG. 1, in response to the logic level shifted control signals output by circuit 120 and circuit 130, transmission switch circuit 110 generally operates to selectively pass the reference voltage VREF to a VREF bus 118. Bus 118 is in turn connected to an input of each input buffer 140 of the logic device, while the other input of each buffer 140 receives an input signal from an I/O terminal 145 of the logic device. A more detailed description of the operation of reference voltage switch circuit 100 is now provided.

The logic core that generates the VREF_CONTROL signal is typically powered by an internal supply signal VCC_INT (not shown), so that the two logic levels of the VREF_CONTROL signal are VSS and VCC_INT. (Although a high logic level signal in a CMOS logic circuit will typically be slightly lower than the VCC supply signal powering the circuit due to a small voltage drop across a pull-up PMOS transistor, for the purposes of the present description this small voltage drop will be ignored.) Since VCC_INT is often different—typically lower—than the VCC_IO and VCC_DED supply levels, level shift circuit 120 is used to shift the logic level of the signal at input 122 from VCC_INT to VCC_DED and level shift circuit 130 is similarly used to shift the logic level of the signal at input 132 from VCC_INT to VCC_IO. In particular, when circuit 120 has a low signal at its input 122, transistor T7 is off while transistor T8 turns on. This pulls the voltage at node 170 low, i.e., to VSS. Transistor T9 is also turned on by the low signal at its gate, pulling node 160 to the VCC_DED level so that transistor T10 is off and node 170 is isolated from VCC_DED. As a result, when the input 122 is low, the output 124 is also low. Similarly, when the input 132 is low, the output 134 is low too.

On the other hand, when the signal at input 122 is high (i.e., at VCC_INT) transistor T7 turns on, while transistor T8 is off. In this case, the voltage at node 160 is pulled low, turning transistor T10 on and pulling the voltage at node 170, and hence at output 124, to the high level of VCC_DED. Transistor T9 is turned off due to the high voltage at its gate. Consequently, circuit 120 shifts the VCC_INT logic level at input 122 to the VCC_DED at output 124. In an identical manner, level shift circuit 130 operates to shift a high VCC_INT logic level at its input 132 to the VCC_IO logic level at its output 134. It will be appreciated that to ensure that transistors T7, T8, T9, and T10 in each of circuits 120 and 130 are sufficiently biased when turned on, the magnitude of the threshold voltages of T7 and T8 may be substantially less than the level of VCC_INT and the magnitude of the threshold voltages of T9 and T10 may be substantially less than VCC_DED or VCC_IO, as appropriate.

Turning now to the operation of transmission switch 110 in circuit 100, when VREF_CONTROL is low, the gates of NMOS transistors T1 and T2 receive a low signal from circuit 120 as described above. Therefore, transistors T1 and T2 are off. Also, when VREF_CONTROL is low, the gates of PMOS transistors T3 and T4 receive a high signal, at the VCC_IO level, from circuit 130. Therefore, transistors T3 and T4 are also off, and transmission switch 10 is in a high impedance state with any signal at the VREF I/O terminal 105 being effectively disconnected from VREF bus 118.

Thus, the logic core may be programmed to set the VREF_CONTROL signal low when using an I/O standard that does not require a reference voltage, such as TTL or LVDS. In this case, for example, bus 118 may be tied to VSS for single-ended input I/O standards or disconnected from input buffers 140 for differential input I/O standards.

Also, when VREF_CONTROL is low, PMOS transistor T5 turns on since its gate is low, and therefore the voltage at the drain of transistor T2 and at the source of transistor T1 is pulled high to VCC_DED. Consequently, even if the voltage at I/O terminal 105 drops below VSS during an undershoot condition and causes transistor T2 to turn on, transistor T1 remains off since its gate-to-source junction is securely reverse-biased by the high voltage at its source. Similarly, NMOS transistor T6 also turns on when VREF_CONTROL is low and therefore the voltage at the drain of transistor T4 and at the source of transistor T3 is pulled low. Thus, if the voltage at I/O terminal 105 rises above VCC_DED during an overshoot condition and causes transistor T4 to turn on, transistor T3 still remains securely off since its source terminal is held lower than its gate terminal.

As described above, in one embodiment transmission switch 110 is a CMOS transmission gate. A basic CMOS transmission gate includes an NMOS transistor in parallel with a PMOS transistor where the gates of each transistor receive complementary signals. With a transmission switch formed by a single NMOS transistor, there may be a considerable voltage drop across the transistor when the voltage at the transistor's source is high, i.e., near VCC, but there is only a small voltage drop when the source voltage is low, i.e., near VSS. Similarly, with a transmission switch formed by a single PMOS transistor, there may be a considerable voltage drop across the transistor when its source is low, while there is only a small voltage drop when the source voltage is high. However, when an NMOS and PMOS transistor are combined in parallel in a CMOS transmission gate, the voltage drop across the transmission gate is greatly reduced since the smaller of the two voltage drops for a given input voltage effectively determines the drop across the gate. In the embodiment of the invention described above, transmission switch 110 includes two series-connected NMOS transistors in parallel with two series-connected PMOS transistors. Having two NMOS and two PMOS transistors in gate 10, in combination with transistors T5 and T6, enables any overshoot or undershoot at the VREF I/O terminal 105 to be isolated from the VREF bus 118 and the remainder of the logic device.

The threshold voltage Vt of a MOSFET transistor, generally defined to be positive for a NMOS transistor and negative for a PMOS transistor, is the lowest gate-to-source (or source-to-gate) voltage that causes a substantial current to flow through the transistor. In effect, the transistor turns on when Vgs>Vt for an NMOS transistor and Vsg>|Vt| for a PMOS transistor, where Vgs is the gate-to-source voltage and Vsg is the source-to-gate voltage. For the transistor to be off and have a low leakage current, Vgs<<Vt for an NMOS transistor and Vsg<<|Vt| for a PMOS transistor. The threshold voltage Vt of a transistor varies depending on a number of factors including the temperature and semiconductor process. Since the transistors in transmission switch 10 should be able to tolerate a high degree of voltage stress as well as have small leakage currents when transmission switch 110 is in the off state, the threshold voltages of transistors T1, T2, T3, and T4 should have a relatively high magnitude. For example, the magnitude of the threshold voltages of transistors T1, T2, T3, and T4 can be in the range of 0.3 V to 0.8 V.

In addition, to ensure that the voltage VREF is adequately passed to the transmission switch output 115 when transmission switch 110 is on, it is desirable that Vgs for both transistors T1 and T2 be significantly greater than the threshold voltage for those transistors. As noted above, VREF is typically in the range of 0.7 to 1.5 V for most existing voltage-referenced I/O standards. At the same time, VCC_IO may be relatively low, e.g., 1.5 V or lower, in such standards. For example, in the HSTL class I and II I/O standards, VREF typical may be 0.75 V and VCC_IO typical may be 1.5 V. If NMOS transistors T1 and T2 are controlled (i.e., gated) by VCC_IO, Vgs for these transistors becomes VCC_IO−VREF, which may be too low for transmission switch 110 to adequately pass the reference voltage at I/O terminal 105 in many instances.

Consequently, in reference voltage switch circuit 100, the dedicated supply signal VCC_DED is used to power transistors T1 and T2 when transmission switch 110 is on, and the level of the VCC_DED supply signal may be selected so that it is greater than the lowest VCC_IO level in any voltage-referenced standard accommodated by the logic device. In one particular embodiment, the level of the VCC_DED supply signal is greater than or equal to about 2.5 V, since for existing voltage-referenced standards this typically ensures that Vgs for each of transistors T1 and T2 is significantly greater than the threshold voltage of those transistors (assuming those threshold voltages are less than about 1 V). More generally, with the flexibility of a dedicated supply voltage for transmission switch 10, VCC_DED can be set to any desired level that is necessary to ensure that VREF is reliably transmitted to VREF bus 118. Optionally, the VCC_DED supply signal may be shorted to the VCC_IO supply when VREF_CONTROL is low and transmission switch 10 is off. In this case, when VREF_CONTROL is low and PMOS transistor T5 turns on, the voltage at the drain of transistor T2 and at the source of transistor T1 is pulled high to VCC_IO.

Although transmission switch circuit 110 may be a CMOS transmission gate with transistors T1, T2, T3, and T4 as described, other transmission switches may also be used. For example, transmission switch 110 may be a basic CMOS transmission gate having a single NMOS transistor, receiving the output of circuit 120 at its gate, in parallel with a single PMOS transistor, receiving the output of circuit 130 at its gate. In this case, overshoot/undershoot protection transistors T5 and T6 are omitted. Alternatively, transmission switch 110 may have more than two NMOS transistors and/or more than two PMOS transistors. In another embodiment, the transmission switch may simply comprise an NMOS transistor, particularly where VCC_DED has a very high level so that the voltage drop across the NMOS transistor is low when conducting. More generally, it will be appreciated that circuit 100 and transmission switch 110 can be adapted for and implemented in IC devices based on other design technologies, such as NMOS or bipolar fabrication technologies.

While the invention has been described in conjunction with specific embodiments, various alternatives and modifications can be made to reference voltage switch circuit 100. For example, inverter 125 may be removed, and the output 134 of logic level shifting circuit 130 may be taken from node 160 in FIG. 2—instead of from node 170 as described above. In this case, level shift circuit 130 "shifts" a VSS logic level at input 132 to a VCC_DED logic level at output 134 and a VCC_INT logic level at input 132 to a VSS logic level at output 134. In addition, if VCC_INT and VCC_IO are at the same or approximately the same voltage level, logic level shifting circuit 130 may be omitted and the output of inverter 125 may be applied directly to the gates of transistors T3, T4, and T6. Such variations are merely exemplary, and numerous other alternatives, modifications, and changes will be apparent to those skilled in the art in light of the foregoing description.

What is claimed is:

1. A switch circuit for selectively providing a reference voltage signal to a logic device that receives an input/output supply signal and is operable in accordance with any one of a plurality of input/output standards, wherein at least one of the plurality of input/output standards is a voltage referenced standard, the switch circuit comprising a transmission switch circuit receiving the reference voltage signal at an input thereof and passing the reference voltage signal to an output thereof in response to a first control signal, the first control signal having a logic level determined by a dedicated supply signal, the dedicated supply signal being different from the input/output supply signal received by the logic device, and a first logic level shifting circuit receiving a master control signal at an input thereof, the master control signal being provided by a logic core of the logic device and having a first logic level determined by a core supply signal, the first logic level shifting circuit further receiving the dedicated supply signal and providing the first control signal at an output thereof.

2. The switch circuit of claim 1 further comprising a second logic level shifting circuit receiving the master control signal at an input thereof, the second logic level shifting circuit further receiving the input/output supply signal and providing a second control signal at an output thereof.

3. The switch circuit of claim 1 wherein when the master control signal is at the logic level determined by the first supply signal, the first control signal is at the logic level determined by the dedicated supply signal.

4. A switch circuit for selectively providing a reference voltage signal to a logic device that receives an input/output supply signal and is operable in accordance with any one of a plurality of input/output standards, wherein at least one of the plurality of input/output standards is a voltage referenced standard, the switch circuit comprising a transmission switch circuit receiving the reference voltage signal at an input thereof and passing the reference voltage signal to an output thereof in response to a first control signal, the first control signal having a logic level determined by a dedicated supply signal, and the dedicated supply signal being different from the input/output supply signal received by the logic device, wherein the transmission switch circuit comprises first and second n-channel metal oxide semiconductor (NMOS) field effect transistors each having a gate terminal for receiving the first control signal wherein a source terminal of the first NMOS transistor provides the transmission switch circuit input, a drain terminal of the second NMOS transistor provides the transmission switch circuit output, and a drain terminal of the first NMOS transistor is coupled to the source terminal of the second NMOS transistor.

5. The switch circuit of claim 4 further comprising a p-channel metal oxide semiconductor (PMOS) field effect transistor having a gate terminal for receiving the first control signal, a drain terminal coupled to the source terminal of the second NMOS transistor, and a source terminal coupled to the dedicated supply signal.

6. The switch circuit of claim 4 wherein the transmission switch circuit further comprises first and second p-channel metal oxide semiconductor (PMOS) field effect transistors each having a gate terminal for receiving a second control signal complementary to the first control signal, the first and second PMOS transistors being in parallel with the first and second NMOS transistors, and wherein the transmission switch circuit passes the reference voltage signal to the transmission switch circuit output in response to the first and second control signals.

7. The switch circuit of claim 4 wherein the output of the transmission switch circuit is coupled to one or more input buffers for one or more I/O terminals of the logic device.

8. A switch circuit for selectively providing a reference voltage signal to a logic device that receives an input/output supply signal and is operable in accordance with any one of a plurality of input/output standards, wherein at least one of the plurality of input/output standards is a voltage referenced standard, the switch circuit comprising a transmission switch circuit receiving a voltage signal at an input thereof and passing the voltage signal to an output thereof in response to a first control signal, the first control signal having a logic level determined by a dedicated supply signal, and the dedicated supply signal being different from an input/output supply signal received by the logic device, wherein the transmission switch circuit comprises first and second n-channel metal oxide semiconductor (NMOS) field effect transistors each having a gate terminal for receiving the first control signal and first and second p-channel metal oxide semiconductor (PMOS) field effect transistors each having a gate terminal for receiving a second control signal complementary to the first control signal, the first and second PMOS transistors being in parallel with the first and second NMOS transistors, and wherein the transmission switch circuit passes the reference voltage signal to the transmission switch circuit output in response to the first and second control signals;

a first logic level shifting circuit receiving a master control signal at an input thereof, the master control signal having a logic level determined by a first supply signal, the first logic level shifting circuit further receiving the dedicated supply signal and providing the first control signal at an output thereof; and a second logic level shifting circuit receiving the master control signal at an input thereof, the second logic level shifting circuit further receiving the input/output supply signal and providing the second control signal at an output thereof.

9. The switch circuit of claim 8 wherein a source terminal of the first NMOS transistor and a source terminal of the first PMOS transistor provide the transmission switch circuit input, a drain terminal of the second NMOS transistor and a drain terminal of the second PMOS transistor provide the transmission switch circuit output, a drain terminal of the first NMOS transistor is coupled to the source terminal of the second NMOS transistor, and a drain terminal of the first PMOS transistor is coupled to the source terminal of the second PMOS transistor.

10. The switch circuit of claim 9 further comprising:
a third PMOS transistor having a gate terminal for receiving the first control signal, a drain terminal coupled to the source terminal of the second NMOS transistor, and a source terminal coupled to the dedicated supply signal; and
a third NMOS transistor having a gate terminal for receiving the second control signal, a drain terminal coupled to the source terminal of the second PMOS transistor, and a source terminal coupled to a common supply reference.

11. A switch circuit for selectively providing a reference voltage signal to a logic device comprising:
a first logic level shifting circuit receiving a master control signal at an input thereof, the master control signal being provided by a logic core of the logic device and having a logic level determined by a core supply signal, the first logic level shifting circuit further receiving an input/output supply signal and providing a first control signal at an output thereof, the first control signal having a logic level determined by the input/output supply signal;
a second logic level shifting circuit for receiving the master control signal at an input thereof, the second logic level shifting circuit further receiving a dedicated supply signal and providing a second control signal at an output thereof, the second control signal having a logic level determined by the dedicated supply signal, the second control signal being complementary to the first control signal, and the dedicated supply signal being different from the input/output supply signal;
a transmission switch circuit having an input for receiving the reference voltage signal, the transmission switch circuit passing the reference voltage signal to an output thereof in response to the first and second control signals.

12. The switch circuit of claim 11 wherein the logic device is operable in accordance with a plurality of input/output standards, wherein at least one of the plurality of input/output standards is a voltage-referenced standard, and wherein the dedicated supply signal has a voltage level greater than the lowest specified voltage level for any voltage-referenced standard.

13. The switch circuit of claim 11 wherein the dedicated supply signal has a voltage level of about 2.5 V or greater.

14. The switch circuit of claim 11 wherein the transmission switch circuit comprises
a first set of transistors comprising one or more transistors of a first type, each having a control terminal for receiving the first control signal; and
a second set of transistors comprising one or more transistors of a second type, each having a control terminal for receiving the second control signal, the first set of transistors and the second set of transistors being in parallel with one another.

15. The switch circuit of claim 14 further comprising:
a pull-down transistor coupled between a transistor in the first set of transistors and a common supply reference, the pull-down transistor being of the second type and having a control terminal for receiving the first control signal; and
a pull-up transistor coupled between a transistor in the second set of transistors and a dedicated supply signal node, the pull-up transistor being of the first type and having a control terminal for receiving the second control signal.

16. The switch circuit of claim 14 wherein
each transistor in the first set is a p-channel metal oxide semiconductor (PMOS) field effect transistor having a gate terminal for receiving the first control signal; and
each transistor in the second set is an n-channel metal oxide semiconductor (NMOS) field effect transistor having a gate terminal for receiving the second control signal.

17. The switch circuit of claim 16 further comprising:
a pull-down NMOS transistor having a gate terminal for receiving the first control signal, a drain terminal coupled to the source terminal of a PMOS transistor in the first set of transistors, and a source terminal coupled to a common supply reference; and a pull-up PMOS transistor having a gate terminal for receiving the second control signal, a drain terminal coupled to the source terminal of an NMOS transistor in the second set of transistors, and a source terminal coupled to the dedicated supply signal.

18. The switch circuit of claim 11 wherein the output of the transmission switch circuit is coupled to one or more input buffers for one or more I/O terminals of the logic device.

19. The switch circuit of claim 11 wherein the first logic level shifting circuit comprises first and second n-channel metal oxide semiconductor (NMOS) field effect transistors and first and second p-channel metal oxide semiconductor (PMOS) field effect transistors, wherein the first and second NMOS transistors each has a source terminal coupled to a common supply reference, the first and second PMOS transistors each has a source terminal coupled to the input/output supply signal, the first NMOS transistor has a drain terminal coupled to a drain terminal of the first PMOS transistor and a gate terminal of the second PMOS transistor, the second NMOS transistor has a drain terminal coupled to a drain terminal of the second PMOS transistor and a gate terminal of the first PMOS transistor, and the first and second NMOS transistors have gate terminals that receive complementary versions of the control signal; and the second logic level shifting circuit comprises first and second n-channel metal oxide semiconductor (NMOS) field effect transistors and first and second p-channel metal oxide semiconductor (PMOS) field effect transistors, wherein the first and second NMOS transistors each has a source terminal coupled to a common supply reference, the first and second PMOS transistors each has a source terminal coupled to the dedicated supply signal, the first NMOS transistor has a drain terminal coupled to a drain terminal of the first PMOS transistor and a gate terminal of the second PMOS transistor, the second NMOS transistor has a drain terminal coupled to a drain terminal of the second PMOS transistor and a gate terminal of the first PMOS transistor, and the first and second NMOS transistors have gate terminals that receive complementary versions of the control signal.

20. A method for selectively providing a reference voltage signal from a switch circuit to a logic device that receives an input/output supply signal and is operable in accordance with any one of a plurality of input/output standards, wherein at least one of the plurality of input/output standards is a voltage referenced standard, comprising:

supplying a dedicated supply signal to the switch circuit, the dedicated supply signal being different from the input/output supply signal received by the logic device;

providing a first control signal having a logic level determined by the dedicated supply signal; and passing the reference voltage signal from a transmission switch input to a transmission switch output in response to the first control signal;

generating a master control signal in a logic core of the logic, device said master control signal having a logic level determined by a core supply signal; and logic level shifting the master control signal to provide the first control signal.

21. The method of claim 20 further comprising logic level shifting the master control signal to provide a second control signal having a logic level determined by the input/output supply signal, and wherein passing the reference voltage signal comprises passing the reference voltage signal in response to the first and second control signals.

22. The method of claim 20 wherein the logic device is operable in accordance with a plurality of input/output standards each having a specified voltage level, wherein at least one of the plurality of input/output standards is a voltage-referenced standard, and wherein the dedicated supply signal has a voltage level greater than the lowest specified voltage level for any voltage-referenced standard.

23. The method of claim 20 wherein the dedicated supply signal has a voltage level of about 2.5 V or greater.

24. The method of claim 20 further comprising:

providing protection against voltage under shoot at the transmission switch input when the voltage reference signal is not being passed to the transmission switch output; and providing protection against voltage over shoot at the transmission switch input when the voltage reference signal is not being passed to the transmission switch output.

25. The method of claim 20 further comprising providing the reference voltage signal, when passed from the transmission switch input to the transmission switch output, to one or more input buffers for one or more I/O terminals of the logic device.

26. The method of claim 20 further comprising shorting a node for providing the dedicated supply signal to the input/output supply signal, when the reference voltage signal is not being passed from the transmission switch input to the transmission switch output.

* * * * *